(12) United States Patent
Wang et al.

(10) Patent No.: US 12,129,901 B2
(45) Date of Patent: Oct. 29, 2024

(54) LEAF SPRING FOR AN INTEGRATED CIRCUIT HEAT SINK

(71) Applicant: NVIDIA CORPORATION, Santa Clara, CA (US)

(72) Inventors: Shenglei Wang, Shenzhen (CN); Qiang Chen, Shenzhen (CN); Yifei Dou, Shenzhen (CN); John Harold Drew, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/420,263

(22) PCT Filed: Apr. 20, 2021

(86) PCT No.: PCT/CN2021/088327
§ 371 (c)(1),
(2) Date: Jul. 1, 2021

(87) PCT Pub. No.: WO2022/222024
PCT Pub. Date: Oct. 27, 2022

(65) Prior Publication Data
US 2024/0019009 A1   Jan. 18, 2024

(51) Int. Cl.
*F16F 1/18* (2006.01)
*H05K 7/20* (2006.01)

(52) U.S. Cl.
CPC ........... *F16F 1/185* (2013.01); *H05K 7/2039* (2013.01)

(58) Field of Classification Search
CPC ............. H01L 23/4093; H01L 23/4006; H01L 23/40; H05K 7/2049; H05K 7/2039; H05K 7/20445
See application file for complete search history.

(56) References Cited

U.S. PATENT DOCUMENTS

| | | | |
|---|---|---|---|
| 10,553,520 B2 | 2/2020 | Iizuka et al. | |
| 2002/0044424 A1* | 4/2002 | Hashimoto | H01L 21/4878 361/709 |
| 2003/0024688 A1* | 2/2003 | Dowdy | H01L 23/4093 257/E23.099 |
| 2007/0146999 A1* | 6/2007 | Lin | H01L 23/4093 257/E23.086 |
| 2009/0201646 A1* | 8/2009 | Yang | H01L 23/4006 361/704 |

(Continued)

*Primary Examiner* — Adam B Dravininkas
(74) *Attorney, Agent, or Firm* — Artegis Law Group, LLP

(57) ABSTRACT

Various embodiments of the present disclosure relate to a leaf spring for coupling a heat sink to an integrated circuit, where the leaf spring includes a central portion that has an aperture, a first spring arm that is formed on a first side of the central portion and includes a first through-hole for a first fastener, and a second spring arm that is formed on a second side of the central portion and includes a second through-hole for a second fastener. In various embodiments, a first bending axis passes through the first side and is substantially perpendicular to a longitudinal axis of the leaf spring that passes through the first through-hole and the second through-hole, and a second bending axis passes through the second side and is substantially perpendicular to the longitudinal axis of the leaf spring.

20 Claims, 6 Drawing Sheets

(56) References Cited

U.S. PATENT DOCUMENTS

| | | | |
|---|---|---|---|
| 2015/0262907 A1* | 9/2015 | Degner | H01L 23/4006 165/104.26 |
| 2019/0104608 A1* | 4/2019 | Laurent | H01L 23/40 |
| 2020/0161211 A1* | 5/2020 | Yang | G06F 1/20 |

* cited by examiner

LEAF SPRING FOR AN INTEGRATED CIRCUIT HEAT SINK

BACKGROUND

Field of the Various Embodiments

The various embodiments relate generally to computer systems and related fabrication technology and, more specifically, to a leaf spring for an integrated circuit heat sink.

DESCRIPTION OF THE RELATED ART

In modern computing systems, central processing units (CPUs), graphics processing units (GPUs), and other integrated circuits (ICs) generate significant quantities of heat during operation. Such generated heat needs to be removed from a computing system for the computer system as well as the individual integrated circuits within the computer system to continue functioning properly. For example, a single high-power chip, such as a CPU or GPU, can generate hundreds of watts of heat during operation, and, if this heat is not efficiently removed from the computer system, the temperature of the chip can increase to a point where the chip can be damaged.

One approach to removing the heat generated by CPUs, GPUs, and other ICs during operation is to employ heat sinks within a computing system. A heat sink is typically designed to efficiently transfer the heat generated by a chip to ambient air, which then carries the heat away from the chip. As a general matter, such heat transfer is more effective when a heat sink is pressed against a heat-generating chip with a substantial amount of pressure. To that end, spring-based devices can be used to fix a heat sink against one or more heat-generating chips within a computing device with relatively high, uniform pressure. For chips having larger surface areas, planar leaf springs have been developed that are positioned on the back side of a printed circuit board (PCB) and are coupled to a heat sink on the front side of the PCB using, for example, threaded fasteners that pass through the PCB. By tightening the threaded fasteners against the elastic spring arms of a leaf spring, the heat sink can be pulled towards the leaf spring and pressed against one or more chips mounted on the front side of the PCB.

One drawback of using leaf springs to fix a heat sink to a chip mounted on a PCB is that a large "keep-out" area is normally required on the back side of the PCB that imposes design constraints on the PCB that can directly impact the performance of the chip. In particular, the keep-out area typically has to accommodate the entire footprint of the leaf spring and spring arms and usually has an area that is equal to or greater than that of the chip. Further, the keep-out area is typically located on the back side of the PCB directly opposite the chip. Accordingly, the keep-out area can prevent ICs or other electronic devices from being mounted on the PCB at locations closest to the chip. Because transmission latencies are generally reduced when electronic components are located closer together, having to locate ICs and other devices outside of the keep-out area can degrade overall performance.

As the foregoing illustrates, what is needed in the art are more effective ways of coupling heat sinks to integrated circuits that are mounted on printed circuit boards.

SUMMARY

A leaf spring for coupling a heat sink to an integrated circuit includes a central portion that has an aperture; a first spring arm that is formed on a first side of the central portion and includes a first through-hole for a first fastener; a second spring arm that is formed on a second side of the central portion and includes a second through-hole for a second fastener; a first bending axis that passes through the first side and is substantially perpendicular to a longitudinal axis of the leaf spring that passes through the first through-hole and the second through-hole; and a second bending axis that passes through the second side and is substantially perpendicular to the longitudinal axis of the leaf spring.

At least one technical advantage of the disclosed leaf spring design relative to the prior art is that the disclosed design enables a heat sink to be coupled to an integrated circuit that is mounted on a printed circuit board using a smaller keep-out area on the back side of the printed circuit board. Accordingly, with the disclosed design, areas of the back side of the printed circuit board directly opposite the integrated circuit or adjacent to the sides of the integrated circuit can remain outside the keep-out area. Another advantage is that the longer spring arms of the disclosed leaf spring design enable the integrated circuit to be pressed against the integrated circuit with greater force while using fewer screws relative to conventional leaf spring designs. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skill in the art that the inventive concepts may be practiced without one or more of these specific details.

System Overview

Figure 1:
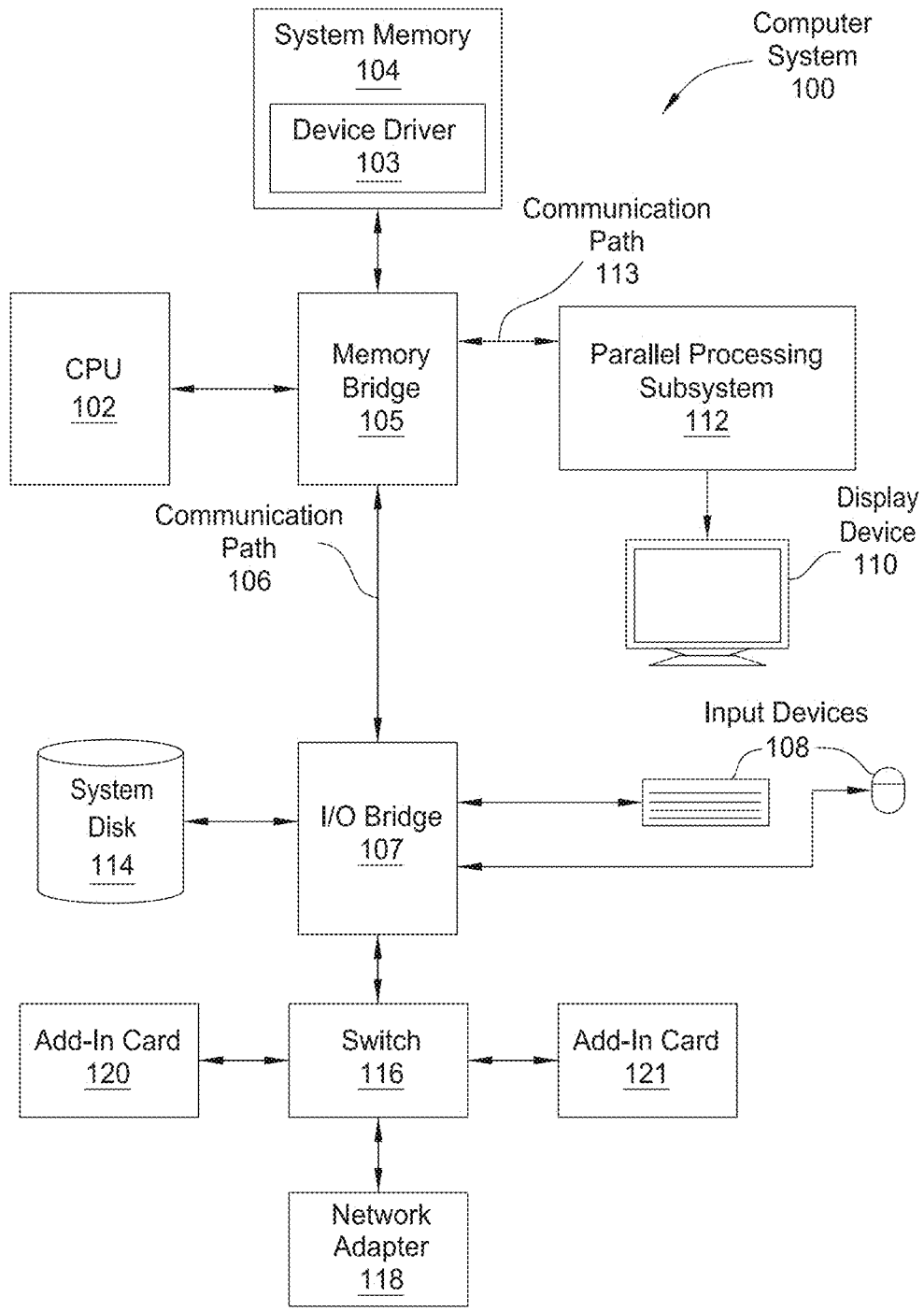
FIG. 1 is a conceptual illustration of a computer system configured to implement one or more aspects of the various embodiments.

FIG. 1 is a conceptual illustration of a computer system 100 configured to implement one or more aspects of the various embodiments. As shown, system 100 includes a central processing unit (CPU) 102 and a system memory 104 communicating via a bus path that may include a memory bridge 105. CPU 102 includes one or more processing cores, and, in operation, CPU 102 is the master processor of system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A display processor 112 is coupled to memory bridge 105 via a bus or other communication path (e.g., a PCI Express, Accelerated Graphics Port, or HyperTransport link); in one embodiment display processor 112 is a graphics subsystem that includes at least one graphics processing unit (GPU) and graphics memory. Graphics memory includes a display memory (e.g.; a frame buffer) used for storing pixel data for each pixel of an output image. Graphics memory can be integrated in the same device as the GPU, connected as a separate device with the GPU, and/or implemented within system memory 104.

Display processor 112 periodically delivers pixels to a display device 110 (e.g., a screen or conventional CRT, plasma, ° LED, SED or LCD based monitor or television). Additionally, display processor 112 may output pixels to film recorders adapted to reproduce computer generated images on photographic film. Display processor 112 can provide display device 110 with an analog or digital signal. In various embodiments, a graphical user interface is displayed to one or more users via display device 110, and the one or more users can input data into and receive visual output from the graphical user interface.

A system disk 114 is also connected to I/O bridge 107 and may be configured to store content and applications and data for use by CPU 102 and display processor 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, display processor 112 incorporates circuitry optimized for graphics and video processing, including, for example, video output circuitry, and constitutes a graphics processing unit (GPU). In another embodiment, display processor 112 incorporates circuitry optimized for general purpose processing. In yet another embodiment, display processor 112 may be integrated with one or more other system elements, such as the memory bridge 105, CPU 102, and I/O bridge 107 to form a system on chip (SoC). In still further embodiments, display processor 112 is omitted and software executed by CPU 102 performs the functions of display processor 112.

Pixel data can be provided to display processor 112 directly from CPU 102. In some embodiments, instructions and/or data representing a scene are provided to a render farm or a set of server computers, each similar to system 100, via network adapter 118 or system disk 114. The render farm generates one or more rendered images of the scene using the provided instructions and/or data. These rendered images may be stored on computer-readable media in a digital format and optionally returned to system 100 for display. Similarly, stereo image pairs processed by display processor 112 may be output to other systems for display, stored in system disk 114, or stored on computer-readable media in a digital format.

Alternatively, CPU 102 provides display processor 112 with data and/or instructions defining the desired output images, from which display processor 112 generates the pixel data of one or more output images, including characterizing and/or adjusting the offset between stereo image pairs. The data and/or instructions defining the desired output images can be stored in system memory 104 or graphics memory within display processor 112. In an embodiment, display processor 112 includes 3D rendering capabilities for generating pixel data for output images from instructions and data defining the geometry, lighting shading, texturing, motion, and/or camera parameters for a scene. Display processor 112 can further include one or more programmable execution units capable of executing shader programs, tone mapping programs, and the like.

Further, in other embodiments, CPU 102 or display processor 112 may be replaced with or supplemented by any technically feasible form of processing device configured process data and execute program code. Such a processing device could be, for example, a central processing unit (CPU), a graphics processing unit (GPU), an application-specific integrated circuit (ASIC), a field-programmable gate array (FPGA), and so forth. In various embodiments any of the operations and/or functions described herein can be performed by CPU 102, display processor 112, or one or more other processing devices or any combination of these different processors.

CPU 102, a render farm, and/or display processor 112 can employ any surface or volume rendering technique known in the art to create one or more rendered images from the provided data and instructions, including rasterization, scan-line rendering REYES or micropolygon rendering, ray casting, ray tracing, image-based rendering techniques, and/or combinations of these and any other rendering or image processing techniques known in the art.

In other contemplated embodiments, system 100 may or may not include other elements shown in FIG. 1, System memory 104 and/or other memory units or devices in system 100 may include instructions that, when executed, cause the robot or robotic device represented by system 100 to perform one or more operations, steps, tasks, or the like.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies display processor 112 is connected to I/O bridge 107 or directly to CPU 102, rather than to memory bridge 105. In still other embodiments, I/O bridge 107 and memory bridge 105 might be integrated into a single chip. The particular components shown herein are optional: for instance, any number of add-in cards or peripheral devices might be supported. In some embodiments, switch 116 is eliminated, and network adapter 118 and add-in cards 120, 121 connect directly to I/O bridge 107.

Electronic Device with Leaf Spring and Heat Sink

Figure 2:
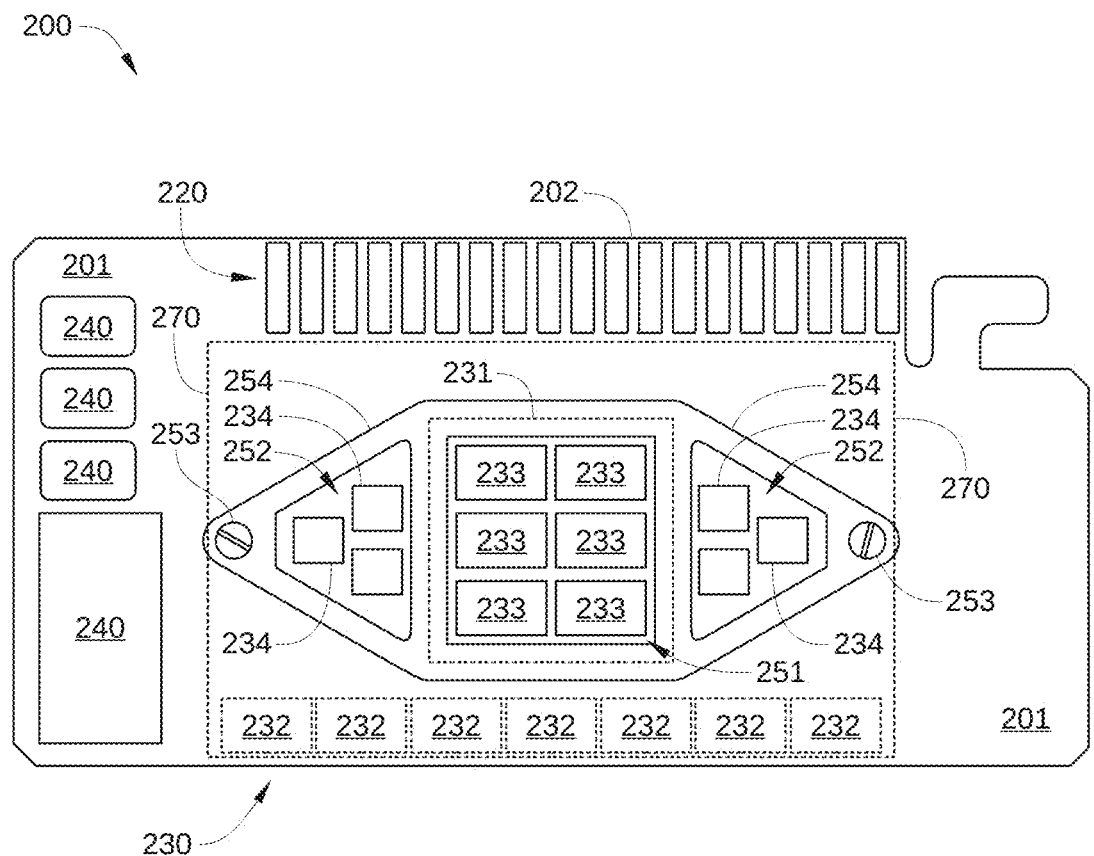
FIG. 2 is a schematic illustration of an electronics device that can be incorporated in the computer system of FIG. 1, according to various embodiments.

FIG. 2 is a schematic illustration of an electronic device 200 that can be incorporated in computer system 100, according to various embodiments. Electronic device 200 is a printed circuit board (PCB) based module or other device and has multiple integrated circuits (ICs) 230 and/or electronic devices 240 included therein. In some embodiments, electronic device 200 is configured as an add-in card, such as a network interface controller, a graphics card, a CPU card, a single-board computer card, a server storage card, and the like. In some embodiments, one or more of the functional modules of computer system 100 of FIG. 1 can be implemented as a PCB-based module using an embodiment of electronic device 200. In such embodiments, functional modules of computer system 100 so implemented include CPU 102, system memory 104, display processor 112, network adapter 118, and/or add-in cards 120 and 121. In some embodiments, multiple functional modules of computer system 100 are implemented as a single electronic device 200. Alternatively or additionally, in some embodiments, a single functional module of computer system 100 is implemented as a single electronic device 200.

Electronic device 200 includes a PCB 201 on which various ICs 230 and electronic devices 240 are mounted. In some embodiments, PCB 201 further includes a plurality of edge connector pins 220 formed on an edge 202 of PCB 201 and a leaf spring 250 that couples a heat sink 270 to PCB 201 and presses heat sink 270 against one or more of ICs 230. ICs 230 and/or electronic devices 240 may be communicatively coupled to edge connector pins 220 and/or each other by any technically feasible electrical connection known in the art, including a ball-grid array (BGA), a pin-grid array (PGA), wire bonding, electrical traces, vias, and/or the like. In the view depicted in FIG. 2, a back side of PCB 201 is shown. Thus, leaf spring 250 is visible, while ICs 230 mounted on a front side of PCB 201 are not visible and are shown as dotted lines.

PCB 201 is a rigid and electrically insulating substrate that provides electronic device 200 with structural rigidity and on which ICs 230 and electronic devices 240 are mounted, Thus, PCB 201 enables electronic device 200 to be removed from and inserted into a suitable interface or slot, such as slot of a server rack, a peripheral component interconnect express (PCIe) slot of a motherboard, and/or the like. In some embodiments, PCB 201 includes a laminate substrate and is composed of a stack of insulative layers or laminates that are built up on the top and bottom surfaces of a core layer. The laminate substrate of PCB 201 can include any materials suitable for use in a PCB, including a phenolic paper substrate (e.g., FR-2, an epoxy paper substrate (e.g., CEM-1 and/or FR-3), an epoxy fiberglass board (e.g., FR-4, FR-5, G-10, and/or G-11), a non-woven glass fiber polyester substrate (e.g., FR-6), a PI polyacrylamide resin base material, and/or the like.

PCB 201 also provides an electrical interface, via electrical traces and vias (not shown), for routing input and output signals, power, and ground connections between ICs 230, electronic devices 240, and/or edge connector pins 220. Edge connector pins 220 provide electrical connections between the ICs 230 and electronic devices 240 of electronic device 200 and other devices external to electronic device 200, such as other PCB-based modules (not shown) of a computing device that includes electronic device 200. For example, such PCB-based modules may include one or more sound cards, graphics cards, network interface cards, and/or the like.

ICs 230 may include one or more processors, memory devices, a solid state drive (SSD), an SOC, and/or the like. The processor or processors can be a high-powered processor, such as CPU 102 and/or display processor 112 of FIG. 1, or any other technically feasible processor or integrated circuit. In the embodiment illustrated in FIG. 2, ICs 230 include a large-area IC 231 (dashed lines), such as a CPU or a GPU, a plurality of front-side-mounted memory devices 232 (dashed lines) mounted on the front side of PCB 201 proximate large-area IC 231, a plurality of back-side-mounted memory devices 233 mounted on the back side of PCB 201 proximate large-area IC 231, and other various back-side-mounted ICs 234. In the embodiment illustrated in FIG. 2, back-side-mounted memory devices 233 are disposed within a central aperture 251 of leaf spring 250, and back-side-mounted ICs 234 are disposed within spring-arm apertures 252 of leaf spring 250. Alternatively or additionally, in other embodiments, one or more of back-side-mounted memory devices 233 and/or back-side-mounted ICs 234 are mounted in other locations on the back side of PCB 201 within central aperture 251 and/or spring-arm apertures 252.

Electronic devices 240 may include one or more power regulators or other power-supplying devices. Alternatively or additionally, in some embodiments, electronic devices 240 include other electronic devices mounted on a front side or back side of PCB 201, such as capacitors, resistors, and/or the like.

Heat sink 270 (dashed lines) is coupled to leaf spring 250 via fasteners 253 and is positioned on the front side of PCB 201 against one or more ICs 230 that are mounted on the front side of PCB 201, In the embodiment illustrated in FIG. 2, fasteners 253 are threaded fasteners, such as screws or bolts. In such an embodiment, torque applied to fasteners 253 elastically deforms spring arms 254 of leaf spring 250, pulls heat sink 270 toward leaf spring 250 and PCB 201, and exerts compressive force on the one or more ICs 230 that are positioned against heat sink 270. In the embodiment illustrated in FIG. 2, large-area IC 231 and memory devices 232 are pressed against heat sink 270 via fasteners 253 and leaf spring 250 in this way.

Leaf Spring with Two Bending Axes

Figure 3:
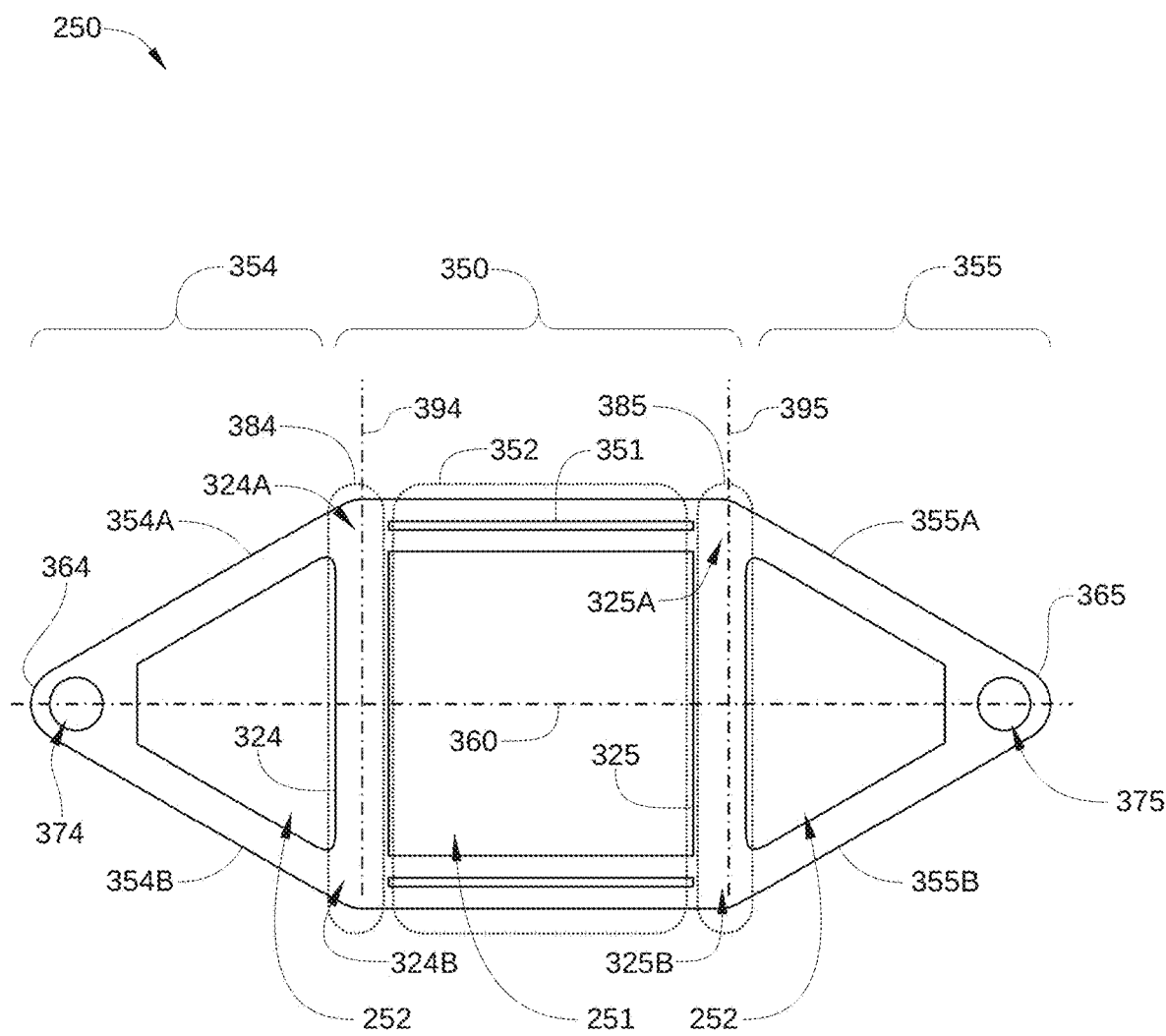
FIG. 3 schematically illustrates a leaf spring of the electronic device of FIG. 2, according to various embodiments.

FIG. 3 schematically illustrates leaf spring 250, according to various embodiments. In the embodiment illustrated in FIG. 3, leaf spring 250 includes a first spring arm 354, a second spring arm 355, and a central portion 350 that includes an aperture 251 formed therein. In such embodiments, a keep-out area associated with leaf spring 250 does not include aperture 251. As a result, ICs and other electronic devices (e.g., back-side-mounted memory devices 233 of FIG. 2) can be positioned on a back side of a PCB opposite a large-area IC mounted on the front side of the PCB (e.g., large-area IC 231 of FIG. 2), which is beneficial to performance of the large-area IC.

In the embodiment illustrated in FIG. 3, first spring arm 354 is formed on or otherwise coupled to a first side 324 of central portion 350. Further, first spring arm 354 includes sub arms 354A and 354B that meet at a feature 364 that forms a fastener through-hole 374. In some embodiments, first spring arm 354 includes more than two sub arms. Similar to first spring arm 354, second spring arm 355 is formed on or otherwise coupled to a second side 325 of central portion 350, and includes two (or more) sub arms 355A and 355B that meet at a feature 365 that forms a fastener through-hole 375. In embodiments in which first spring arm 354 includes multiple sub arms (ag sub arms 354A and 354B as shown in FIG. 3), first spring arm 354 further includes a spring-arm aperture 252, and in embodiments in which second spring arm 355 includes multiple sub arms (e.g. sub arms 355A and 355B as shown in FIG. 3), second spring arm 355 further includes a spring-arm aperture 252. In such embodiments, a keep-out area associated with leaf spring 250 does not include apertures 252. As a result, ICs and other electronic devices can be positioned on a back side of a PCB proximate the sides of a large-area IC mounted on the front side of the PCB, which is beneficial to performance of the large-area IC.

In some embodiments, central portion 350 is rectangular as shown in FIG. 3, and second side 325 is a side of central portion that is opposite to first side 324. In such embodiments, leaf spring 250 includes a longitudinal axis 360 that passes through feature 364 and feature 365. In some embodiments, longitudinal axis 360 also passes through fastener through-hole 374 and fastener through-hole 375. In the embodiment illustrated in FIG. 3, first sub-arm 354A of first spring arm 354 is coupled to first side 324 at a first point 324A, second sub-arm 354B of first spring arm 354 is coupled to first side 324 at a second point 324B, and longitudinal axis 360 is substantially equidistant from first point 324A and second point 324E (e.g., a minimum distance between longitudinal axis 360 and first point 324A is within 10% of the minimum distance between longitudinal axis 360 and second point 324B), Likewise, first sub-arm 355A of second spring arm 355 is coupled to second side 325 at a first point 325A, second sub-arm 355E of second spring arm 355 is coupled to second side 325 at a second point 325B, and longitudinal axis 360 is substantially equidistant from first point 325A and second point 325B.

According to various embodiments, in addition to aperture 251, central portion 350 includes one or more stiffener features 351, a first bending region 384, and a second bending region 385.

The one or more stiffener features 351 are formed on or otherwise coupled to or included in a stiffened region 352 of central portion 350 and are configured to increase resistance to bending of stiffened region 352. In particular, stiffener feature(s) 351 are configured to increase such resistance with respect to a bending moment about a bending axis 394 and/or a bending axis 395 (described below). Stiffener feature(s) 351 can be any technically feasible structural feature(s) that increase such resistance to bending. For example, in some embodiments, a stiffener feature 351 includes one or more of a rib (shown in FIG. 3) that is oriented substantially perpendicular to the plane of leaf spring 250; a thicker region included in or a layer of additional material attached to stiffened region 352; a material included in stiffened region 352 that has a higher modulus of elasticity than a material included in first bending region 384, second bending region 385, first spring arm 354, and/or second spring arm 355; and/or the like.

First bending region 384 is a portion of first side 324 that is proximate to and/or includes a region of central portion 350 coupled to first spring arm 354. Likewise, second bending region 385 is a portion of second side 325 that is proximate to and/or includes a region of central portion 350 coupled to second spring arm 355. First bending region 384 is configured to have a resistance to bending with respect to bending axis 394 that is less than the resistance to bending with respect to bending axis 394 of stiffened region 352. In some embodiments, bending axis 394 passes through first side 324 of central portion 350, as shown in FIG. 3. In addition, in some embodiments, bending axis 394 passes through first bending region 384. Further, in some embodiments, bending axis 394 is perpendicular or substantially perpendicular to longitudinal axis 360, for example within about 10 degrees of perpendicular to longitudinal axis 360. Similar to first bending region 384, second bending region 385 is configured to have a resistance to bending with respect to bending axis 395 that is less than the resistance to bending with respect to bending axis 395 of stiffened region 352. In some embodiments, bending axis 395 passes through second side 325 of central portion 350, as shown in FIG. 3. In addition, in some embodiments, bending axis 395 passes through second bending region 385. Further, in some embodiments, bending axis 395 is substantially perpendicular to longitudinal axis 360, for example within about degrees of perpendicular to longitudinal axis 360.

Figure 4:
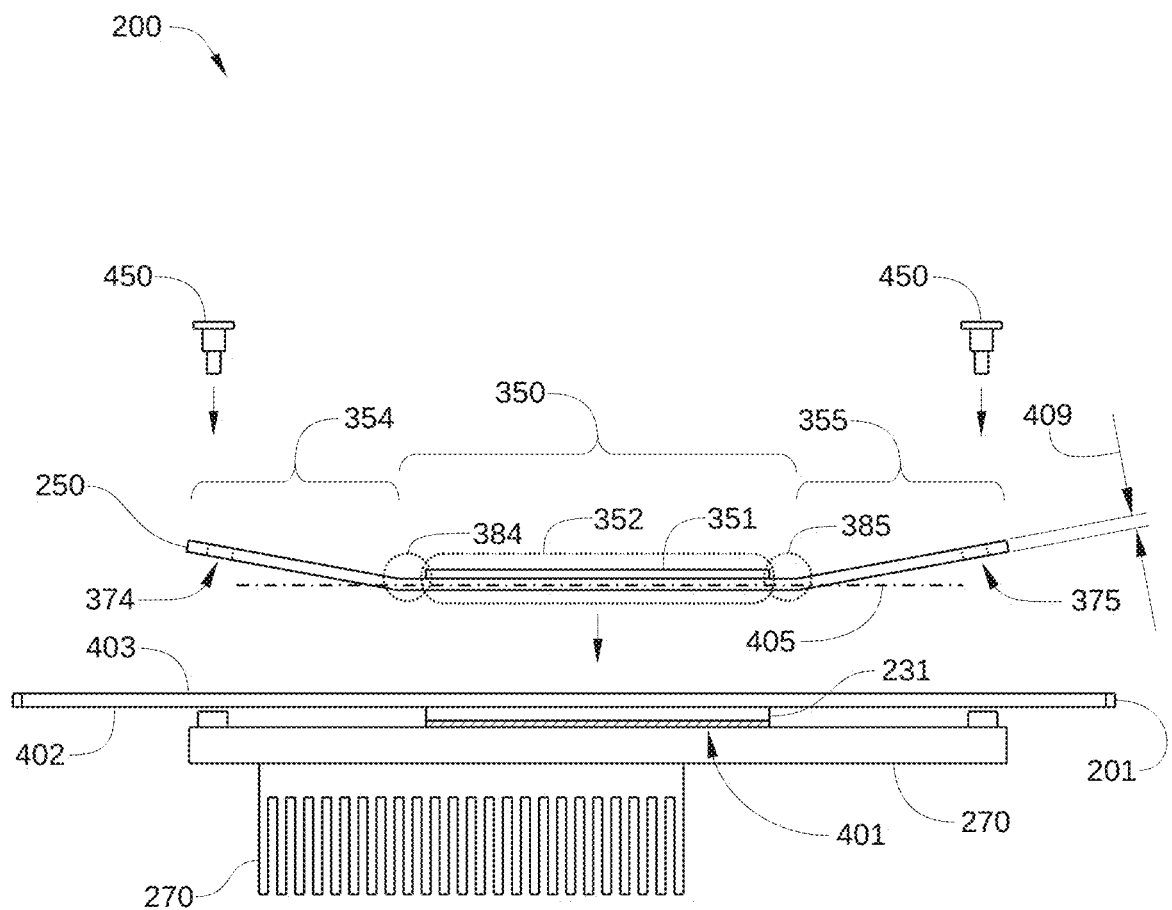
FIG. 4 is an exploded side view showing how the leaf spring of FIG. 2 can be used to couple a heat sink to an integrated circuit of the electronic device of FIG. 2, according to various embodiments.

FIG. 4 is an exploded side view showing how leaf spring 250 can be used to couple heat sink 270 to an integrated circuit of computing device 200, according to various embodiments. In FIG. 4, leaf spring 250 and fasteners 450 are depicted prior to installation in computing device 200. Thus, leaf spring 250 is not in contact with PCB 201 and fasteners 253 are not inserted into through-holes 374 and 375 and engaged with heat sink 270. In addition, in FIG. 4, stiffened region 352 of leaf spring 250 is substantially aligned and/or at least partially overlaps with large-area IC 231, to facilitate uniform application of compressive force to large-area IC 231 via leaf spring 250, fasteners 450, and heat sink 270. As shown, large-area IC 231 is mounted on a front side 402 of PCB 201 and is thermally coupled to heat sink 270 via a thermal interface material 401 (cross-hatched), such as a thermal paste.

In the embodiment illustrated in FIG. 4, elements of leaf spring 250 (e.g., first spring arm 354, second spring arm 355, stiffened region 352, first bending region 384, and/or second bending region 385) are each configured with a same thickness 409 or substantially same thickness, for example having a thickness that is within about 20% of each other. In other embodiments, some or all elements of leaf spring 250 may be configured with different thicknesses, for example to achieve a specific resistance to bending with respect to a bending moment about bending axis 394 and/or bending axis 395 (shown in FIG. 3).

Also shown in FIG. 4 is the unloaded orientation of first spring arm 354 and second spring arm 355 relative to central portion 350. In the embodiment illustrated in FIG. 4, when not under load, first spring arm 354 and second spring arm 355 are angled out of a plane 405 of leaf spring 250. By contrast, when fasteners 450 are inserted into through-holes 374 and 375 and are coupled to heat sink 270, central portion 350 is pressed against a back side 403 of PCB 201 via elastic deformation of first spring arm 354, second spring arm 355, and, to a lesser extent, stiffened region 352 of central portion 350. One embodiment of such elastic deformation is described below in conjunction with FIG. 5.

Figure 5:
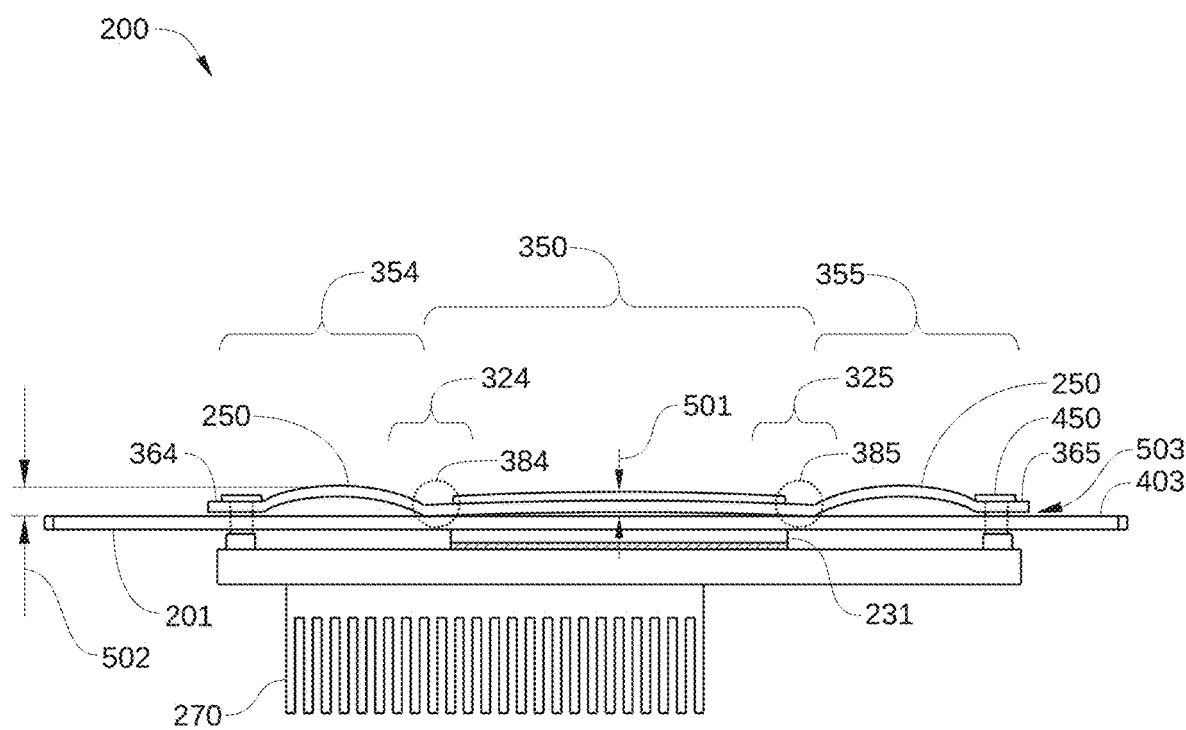
FIG. 5 is a side view of a heat sink coupled to an integrated circuit of the electronic device of FIG. 2 via the leaf spring of FIG. 2, according to various embodiments.

FIG. 5 is a side view of heat sink 270 coupled to an integrated circuit of electronic device 200, according to various embodiments. As shown, in FIG. 5, leaf spring 250 is coupled to PCB 201 via fasteners 450 and heat sink 270. Also shown in FIG. 5 is the elastic deformation of first spring arm 354, second spring arm 355, and central portion 350 when under load. Generally, stiffened region 352 has greater resistance to bending than first bending region 384, second bending region 385, first spring arm 354, and/or second spring arm 355. As a result, in some embodiments, stiffened region 352 extends away from back side 403 of PCB 201 at a height 501 that is less than or equal to a height 502 that first spring arm 354 and/or second spring arm 355 extends away from back side 403 of PCB 201. In other embodiments, depending on various factors that affect elastic deformation of first spring arm 345, second spring arm 355, and stiffened region 352 (e.g., spring arm length, spring arm width, stiffening feature configuration, and/or the like), height 501 may be greater than or equal to height 502. In either situation, one of skill in the art can select values for the various factors affecting elastic deformation of first spring arm 345, second spring arm 355, and stiffened region 352, so that height 501 and height 502 do not exceed a thickness specification for electronic device 200.

It is noted that because stiffened region 352 has greater resistance to bending than other elements of leaf spring 250 (e.g., first spring arm 354, second spring arm 355, first bending region 384, and/or second bending region 385), first side 324 and second side 325 of central portion 350 remain in contact with PCB 201 when leaf spring 250 is under load, thereby exerting compressive force against PCB 201 and large-area IC 231. It is further noted that because first side 324 and second side 325 of central portion 350 remain in contact with PCB 201 when leaf spring 250 is under load, leaf spring 250 is not prone to rocking about a longitudinal axis of leaf spring 250, such as longitudinal axis 360 shown in FIG. 3. Further, in some embodiments, when leaf spring 250 is coupled to PCB 201 via fasteners 450 and heat sink 270, feature 364 and feature 365 are each separated from back side 403 by a clearance 503 or other gap.

In the embodiments described above, first spring arm 354 and second spring arm 355 each include multiple sub arms. In other embodiments, the spring arms of a leaf spring include no sub arms. One such embodiment is described below in conjunction with FIG. 6.

Figure 6:
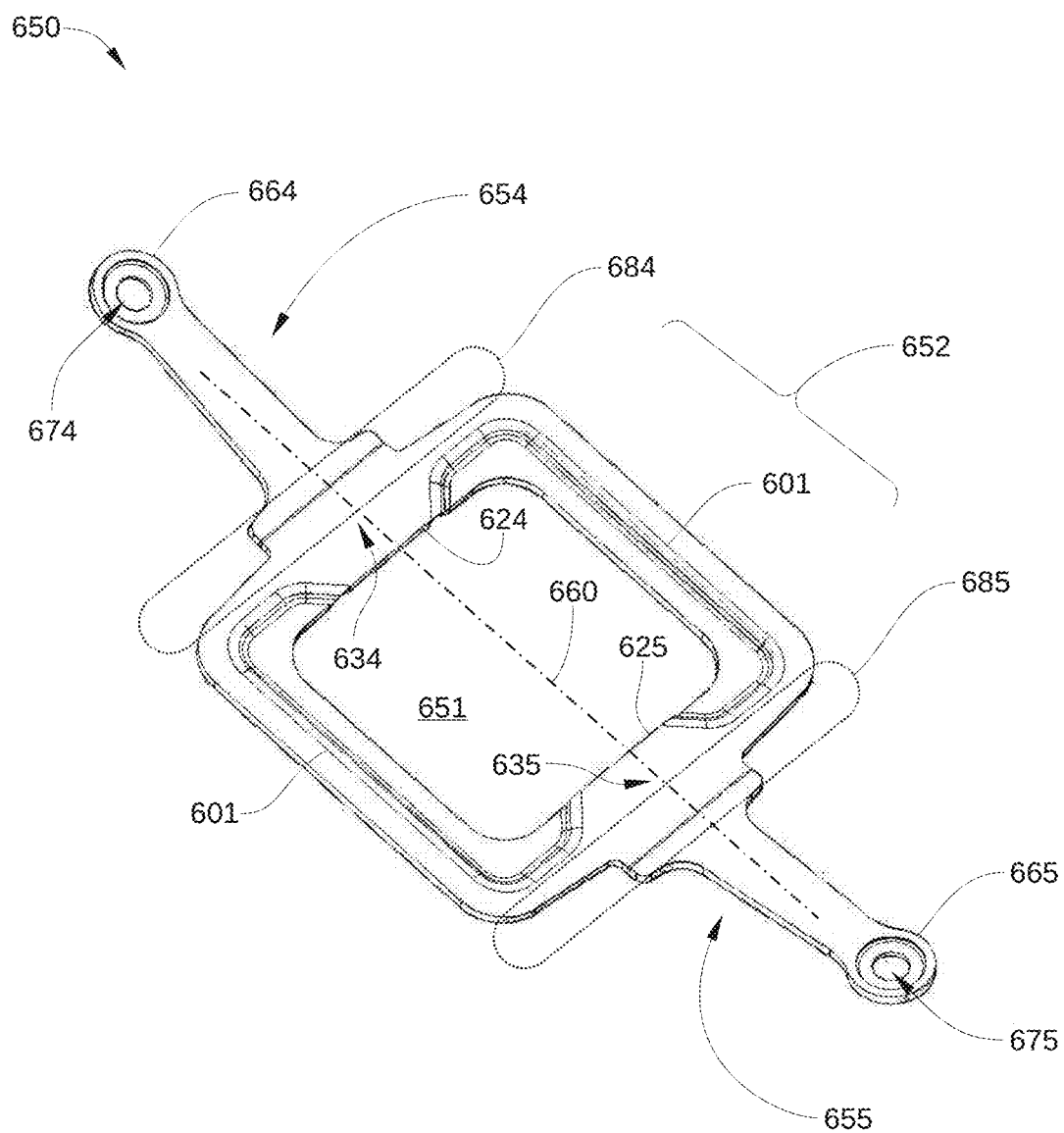
FIG. 6 is a perspective view of a leaf spring that can be included in the electronic device of FIG. 2, according to other various embodiments.

FIG. 6 is a perspective view of a leaf spring 650 that can be included in electronic device 200, according to various other embodiments. As shown, in FIG. 6, leaf spring 650 includes a first spring arm 654, a second spring arm 655, and a central portion 652 that includes an aperture 651 formed therein. Leaf spring 650 further includes one or more stiffening features 601 disposed in some portion of central portion 652, as well as a first bending region 684 associated with first spring arm 654 and a second bending region 685 associated with second spring arm 655. As shown, first spring arm 654 and a second spring arm 655 do not include multiple sub arms. Similar to previously described embodiments, first spring arm 654 includes a feature 664 that forms a fastener through-hole 674 and second spring arm 655 includes a feature 665 that forms a fastener through-hole 675.

In the embodiment illustrated in FIG. 6, first spring arm 654 extends from a first side 624 of central portion 650 at a first point 634 through which a longitudinal axis 660 passes and second spring arm 655 extends from a second side 625 of central portion 650 at a second point 635 through which longitudinal axis 660 passes.

In sum, the various embodiments shown and provided herein set forth a leaf spring for coupling a heat sink to a PCB-mounted IC. The leaf spring includes a first spring arm and a second spring arm that are generally aligned along a longitudinal axis of the leaf spring. The leaf spring further includes a first bending axis and a second bending axis are oriented perpendicular to the longitudinal axis of the leaf spring and encourage a center portion of the leaf spring to maintain contact with a PCB when the leaf spring is under load.

At least one technical advantage of the disclosed leaf spring relative to the prior art is that the disclosed leaf spring enables a heat sink to be coupled to a PCB-mounted IC with a smaller keep-out area on the PCB back side. In particular, areas of the PCB back side directly opposite the PCB or adjacent to the sides of the PCB can remain outside the keep-out area. A further advantage is that the longer spring arms of the disclosed leaf spring can press the heat sink against the IC with greater force while using fewer screws than conventional leaf springs. These technical advantages provide one or more technological advancements over prior art approaches.

1. In some embodiments, a leaf spring for coupling a heat sink to an integrated circuit includes: a central portion that has an aperture; a first spring arm that is formed on a first side of the central portion and includes a first through-hole for a first fastener; a second spring arm that is formed on a second side of the central portion and includes a second through-hole for a second fastener; a first bending axis that passes through the first side and is substantially perpendicular to a longitudinal axis of the leaf spring that passes through the first through-hole and the second through-hole; and a second bending axis that passes through the second side and is substantially perpendicular to the longitudinal axis of the leaf spring.

2. The leaf spring of clause 1, wherein the first spring arm, the second spring arm, and the central portion have a substantially similar thickness.

3. The leaf spring of clauses 1 or 2, wherein the first spring arm has a first resistance to a bending moment, the second spring arm has a second resistance to a bending moment, and the central portion has a third resistance to a bending moment that is greater than both the first resistance and the second resistance.

4. The leaf spring of any of clauses 1-3, wherein the each of the first resistance, the second resistance, and the third resistance is associated with a bending moment about an axis that is substantially perpendicular to the longitudinal axis of the leaf spring.

5. The leaf spring of any of clauses 1-4, wherein the central portion includes at least one stiffening feature that increases the third resistance relative to both the first resistance and the second resistance.

6. The leaf spring of any of clauses 1-5, wherein: the first spring arm causes the heat sink to exert a first compressive force against the integrated circuit when the first threaded fastener couples the first spring arm to the heat sink; and the second spring arm causes the heat sink to exert a second compressive force against the integrated circuit when the second threaded fastener couples the second spring arm to the heat sink.
7. The leaf spring of any of clauses 1-6, wherein: the first spring arm exerts a first compressive force on a printed circuit board disposed between the heat sink and the leaf spring when the first threaded fastener couples the first spring arm to the heat sink; and the second spring arm exerts a second compressive force on the printed circuit board disposed between the heat sink and the leaf spring when the second threaded fastener couples the second spring arm to the heat sink.
8. The leaf spring of any of clauses 1-7, wherein the first spring arm exerts the first compressive force on the printed circuit board via the central portion, and wherein the second spring arm exerts the second compressive force on the printed circuit board via the central portion.
9. The leaf spring of any of clauses 1-8, wherein the first spring arm extends from the first side of the central portion at a first point through which the longitudinal axis of the leaf spring passes.
10. The leaf spring of any of clauses 1-9, wherein the second spring arm extends from the second side of the central portion at a second point through which the longitudinal axis of the leaf spring passes.
11 The leaf spring of any of clauses 1-10, wherein the first spring arm includes a plurality of sub arms, wherein each sub arm is coupled to the first side of the central portion at a different point on the first side.
12. The leaf spring of any of clauses 1-11, wherein the second spring arm includes a plurality of sub arms, wherein each sub arm is coupled to the second side of the central portion at a different point on the second side.
13, The leaf spring of any of clauses 1-12, wherein a first sub arm of the first spring arm is coupled to the first side at a first point, a second sub arm of the first spring arm is coupled to the first side at a second point, and the longitudinal axis of the leaf spring is located substantially equidistant from the first point and the second point.
14. In some embodiments, an electronic device includes: a printed circuit board with an integrated circuit mounted on a first area of a first surface of the printed circuit board; a heat sink configured to be coupled to a surface of the integrated circuit; and a spring apparatus that includes: a central portion with an aperture; a first spring arm that is formed on a first side of the central portion and includes a first through-hole for a first fastener that couples the leaf spring to the heat sink; a second spring arm that is formed on a second side of the central portion and includes a second through-hole for a second fastener that couples the spring apparatus to the heat sink; a first bending axis that passes through the first side and is perpendicular to a longitudinal axis of the spring apparatus that passes through the first through-hole and the second through-hole; and a second bending axis that passes through the second side and is substantially perpendicular to the longitudinal axis of the spring apparatus.
15. The electronic device of clause 14, wherein the first spring arm and the second spring arm position the central portion on a second area of a second surface of the printed circuit board when the first fastener and the second fastener couple the spring apparatus to the heat sink,
16. The electronic device of clauses 14 or 15, wherein the integrated circuit is disposed on a second area of a second surface of the printed circuit board that is opposite to the first area of the first surface.
17, The electronic device of any of clauses 14-16, wherein the second area of the second surface at least partially overlaps the first area of the first surface.
18. The electronic device of any of clauses 14-17, wherein the first spring arm is configured to undergo a first elastic deformation when the first fastener couples the spring apparatus to the heat sink and the second spring arm is configured to undergo a second elastic deformation when the second fastener couples the spring apparatus to the heat sink.
19. The electronic device of any of clauses 14-18, wherein: the first elastic deformation causes the first spring arm to extend away from the printed circuit board for a first height; and the second elastic deformation causes the second spring arm to extend away from the printed circuit board for a second height.
20. The electronic device of any of clauses 14-19, wherein: the first elastic deformation causes the first spring arm to extend away from the printed circuit board for a first height; the second elastic deformation causes the second spring arm to extend away from the printed circuit board for a second height; and the first elastic deformation and the second elastic deformation cause the central portion to extend away from the printed circuit board for a third height that is less than the first height and the second height.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow,

What is claimed is:
1. A leaf spring for coupling a heat sink to an integrated circuit, the leaf spring comprising:
a central portion that has an aperture, wherein the integrated circuit is mounted on a first surface of a printed circuit board, and one or more additional integrated circuits are mounted to a second surface of the printed circuit board within the aperture;
a first spring arm that is formed on a first side of the central portion and includes a first through-hole for a first fastener;
a second spring arm that is formed on a second side of the central portion and includes a second through-hole for a second fastener;
a first bending axis that passes through the first side and is substantially perpendicular to a longitudinal axis of the leaf spring that passes through the first through-hole and the second through-hole; and a second bending axis that passes through the second side and is substantially perpendicular to the longitudinal axis of the leaf spring.

2. The leaf spring of claim 1, wherein the first spring arm, the second spring arm, and the central portion have a substantially similar thickness.

3. The leaf spring of claim 1, wherein the first spring arm has a first resistance to a bending moment, the second spring arm has a second resistance to a bending moment, and the central portion has a third resistance to a bending moment that is greater than both the first resistance and the second resistance.

4. The leaf spring of claim 3, wherein the each of the first resistance, the second resistance, and the third resistance is associated with a bending moment about an axis that is substantially perpendicular to the longitudinal axis of the leaf spring.

5. The leaf spring of claim 3, wherein the central portion includes at least one stiffening feature that increases the third resistance relative to both the first resistance and the second resistance.

6. The leaf spring of claim 1, wherein:
the first spring arm causes the heat sink to exert a first compressive force against the integrated circuit when the first fastener couples the first spring arm to the heat sink; and
the second spring arm causes the heat sink to exert a second compressive force against the integrated circuit when the second fastener couples the second spring arm to the heat sink.

7. The leaf spring of claim 1, wherein:
the first spring arm exerts a first compressive force on the printed circuit board disposed between the heat sink and the leaf spring when the first fastener couples the first spring arm to the heat sink; and
the second spring arm exerts a second compressive force on the printed circuit board disposed between the heat sink and the leaf spring when the second fastener couples the second spring arm to the heat sink.

8. The leaf spring of claim 7, wherein the first spring arm exerts the first compressive force on the printed circuit board via the central portion, and wherein the second spring arm exerts the second compressive force on the printed circuit board via the central portion.

9. The leaf spring of claim 1, wherein the first spring arm extends from the first side of the central portion at a first point through which the longitudinal axis of the leaf spring passes.

10. The leaf spring of claim 9, wherein the second spring arm extends from the second side of the central portion at a second point through which the longitudinal axis of the leaf spring passes.

11. The leaf spring of claim 1, wherein the first spring arm includes a plurality of sub arms, wherein each sub arm is coupled to the first side of the central portion at a different point on the first side.

12. The leaf spring of claim 11, wherein the second spring arm includes a plurality of sub arms, wherein each sub arm is coupled to the second side of the central portion at a different point on the second side.

13. The leaf spring of claim 11, wherein a first sub arm of the first spring arm is coupled to the first side at a first point, a second sub arm of the first spring arm is coupled to the first side at a second point, and the longitudinal axis of the leaf spring is located substantially equidistant from the first point and the second point.

14. An electronic device, comprising:
a printed circuit board with an integrated circuit mounted on a first area of a first surface of the printed circuit board and one or more additional integrated circuits mounted on a second surface of the printed circuit board;
a heat sink configured to be coupled to a surface of the integrated circuit; and
a spring apparatus that includes:
a central portion with an aperture, wherein the one or more additional integrated circuits are disposed within the aperture;
a first spring arm that is formed on a first side of the central portion and includes a first through-hole for a first fastener that couples the leaf spring to the heat sink;
a second spring arm that is formed on a second side of the central portion and includes a second through-hole for a second fastener that couples the spring apparatus to the heat sink;
a first bending axis that passes through the first side and is perpendicular to a longitudinal axis of the spring apparatus that passes through the first through-hole and the second through-hole; and
a second bending axis that passes through the second side and is substantially perpendicular to the longitudinal axis of the spring apparatus.

15. The electronic device of claim 14, wherein the first spring arm and the second spring arm position the central portion on the second area of the second surface of the printed circuit board when the first fastener and the second fastener couple the spring apparatus to the heat sink.

16. The electronic device of claim 14, wherein the first spring arm and the second spring arm position the central portion on the second area of the second surface of the printed circuit board that is opposite to the first area of the first surface.

17. The electronic device of claim 16, wherein the second area of the second surface at least partially overlaps the first area of the first surface.

18. The electronic device of claim 14, wherein the first spring arm is configured to undergo a first elastic deformation when the first fastener couples the spring apparatus to the heat sink and the second spring arm is configured to undergo a second elastic deformation when the second fastener couples the spring apparatus to the heat sink.

19. The electronic device of claim 18, wherein:
the first elastic deformation causes the first spring arm to extend away from the printed circuit board for a first height; and
the second elastic deformation causes the second spring arm to extend away from the printed circuit board for a second height.

20. The electronic device of claim 18, wherein:
the first elastic deformation causes the first spring arm to extend away from the printed circuit board for a first height;
the second elastic deformation causes the second spring arm to extend away from the printed circuit board for a second height; and
the first elastic deformation and the second elastic deformation cause the central portion to extend away from the printed circuit board for a third height that is less than the first height and the second height.

* * * * *